(12) United States Patent
Chen et al.

(10) Patent No.: US 11,557,359 B2
(45) Date of Patent: Jan. 17, 2023

(54) SHIFT REGISTER AND GATE DRIVER CIRCUIT

(71) Applicant: E Ink Holdings Inc., Hsinchu (TW)

(72) Inventors: Shyh-Feng Chen, Hsinchu (TW); Wen-Yu Kuo, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 23 days.

(21) Appl. No.: 16/677,577

(22) Filed: Nov. 7, 2019

(65) Prior Publication Data

US 2020/0168285 A1 May 28, 2020

(30) Foreign Application Priority Data

Nov. 27, 2018 (CN) .......................... 201811424162.2

(51) Int. Cl.
*G11C 19/00* (2006.01)
*G11C 19/28* (2006.01)
*G09G 3/20* (2006.01)

(52) U.S. Cl.
CPC ............... *G11C 19/28* (2013.01); *G09G 3/20* (2013.01); *G09G 2310/0286* (2013.01)

(58) Field of Classification Search
None
See application file for complete search history.

(56) References Cited

U.S. PATENT DOCUMENTS

| 4,593,210 | A | 6/1986 | Boyer |
| 5,118,972 | A | 6/1992 | Wissel et al. |
| 5,334,888 | A | 8/1994 | Bodas |
| 5,675,352 | A | 10/1997 | Rich et al. |
| 5,861,861 | A | 1/1999 | Nolan et al. |
| 5,870,409 | A | 2/1999 | Yach et al. |
| 5,896,395 | A | 4/1999 | Lee |
| 6,100,728 | A | 8/2000 | Shreve et al. |

(Continued)

FOREIGN PATENT DOCUMENTS

| CN | 103187040 | 7/2013 |
| CN | 203085140 | 7/2013 |

(Continued)

OTHER PUBLICATIONS

"Office Action of Taiwan Counterpart Application", dated Feb. 4, 2020, p. 1-p. 8.

(Continued)

*Primary Examiner* — Tuan T Lam
(74) *Attorney, Agent, or Firm* — JCIPRNET

(57) ABSTRACT

A shift register and a gate driver circuit are provided. The shift register includes an input unit, an output unit, an electrostatic discharge unit and a reset unit. The input unit provides an input signal. The output unit is coupled to the input unit and a gate output terminal. The output unit outputs an output signal through the gate output terminal according to the input signal. The electrostatic discharge unit is coupled to the output unit. After the gate output terminal outputs the output signal, the electrostatic discharge unit pulls down a voltage of the gate output terminal according to a low gate voltage. The reset unit is coupled to the input unit and the output unit. After the electrostatic discharge unit pulls down the voltage of the gate output terminal, the reset unit resets a voltage of a bootstrap node.

3 Claims, 7 Drawing Sheets

(56) References Cited

U.S. PATENT DOCUMENTS

| | | | |
|---|---|---|---|
| 6,339,413 B1 | 1/2002 | Drake et al. | |
| 6,501,324 B2 | 12/2002 | Ruegg et al. | |
| 7,545,198 B2 | 6/2009 | Tamagawa | |
| 7,822,469 B2 | 10/2010 | Lo | |
| 8,203,377 B2 | 6/2012 | Kelley et al. | |
| 8,259,054 B2 | 9/2012 | Lee | |
| 8,457,272 B2 | 6/2013 | Yokoyama et al. | |
| 8,542,178 B2 | 9/2013 | Yoo et al. | |
| 8,711,132 B2 | 4/2014 | Chang et al. | |
| 8,756,294 B2 | 6/2014 | Anderson et al. | |
| 8,774,346 B2 | 7/2014 | Son | |
| 8,902,145 B2 | 12/2014 | Umezaki et al. | |
| 9,019,001 B2 | 4/2015 | Kelley et al. | |
| 9,146,041 B2 | 9/2015 | Novotny et al. | |
| 9,224,726 B2 | 12/2015 | Pardoen et al. | |
| 9,337,625 B2 | 5/2016 | Miyazawa | |
| 9,470,943 B2 | 10/2016 | Tang et al. | |
| 9,478,171 B2 | 10/2016 | Song et al. | |
| 9,536,903 B2 | 1/2017 | Umezaki et al. | |
| 9,672,930 B2 | 6/2017 | Tran et al. | |
| 2004/0085284 A1 | 5/2004 | Chen et al. | |
| 2008/0055505 A1* | 3/2008 | Yeh | G02F 1/136204 349/40 |
| 2008/0062112 A1* | 3/2008 | Umezaki | G02F 1/136213 345/100 |
| 2008/0079001 A1* | 4/2008 | Umezaki | H01L 27/1251 257/59 |
| 2008/0079685 A1* | 4/2008 | Umezaki | G11C 19/28 345/100 |
| 2009/0224245 A1* | 9/2009 | Umezaki | G02F 1/136286 257/59 |
| 2010/0078425 A1* | 4/2010 | Wang | F24H 3/004 219/538 |
| 2010/0245307 A1* | 9/2010 | Kimura | G09G 3/3696 345/206 |
| 2010/0316182 A1 | 12/2010 | Lai | |
| 2011/0018001 A1 | 1/2011 | Tsai et al. | |
| 2011/0216874 A1 | 9/2011 | Toyotaka | |
| 2011/0234577 A1 | 9/2011 | Yang et al. | |
| 2012/0062528 A1* | 3/2012 | Kimura | G09G 3/3648 345/204 |
| 2012/0170707 A1 | 7/2012 | Hsu et al. | |
| 2013/0034199 A1 | 2/2013 | Toyotaka | |
| 2013/0063405 A1 | 3/2013 | Zhou | |
| 2013/0070891 A1 | 3/2013 | Tsai et al. | |
| 2013/0077736 A1* | 3/2013 | Son | G09G 3/2085 377/69 |
| 2013/0169609 A1* | 7/2013 | Son | G11C 19/287 345/209 |
| 2013/0235003 A1 | 9/2013 | Chang et al. | |
| 2014/0078124 A1 | 3/2014 | Chen | |
| 2014/0119491 A1 | 5/2014 | Liu | |
| 2014/0145181 A1* | 5/2014 | Yamazaki | H02H 9/045 257/43 |
| 2014/0145625 A1 | 5/2014 | Yamazaki et al. | |
| 2014/0175436 A1* | 6/2014 | Yamazaki | H01L 27/1225 257/43 |
| 2014/0176410 A1 | 6/2014 | Ma et al. | |
| 2015/0221265 A1 | 8/2015 | Huang et al. | |
| 2015/0248940 A1 | 9/2015 | Yang et al. | |
| 2015/0302936 A1 | 10/2015 | Ma | |
| 2015/0323823 A1 | 11/2015 | Yamazaki et al. | |
| 2015/0348596 A1 | 12/2015 | Yao et al. | |
| 2016/0005372 A1 | 1/2016 | Yu | |
| 2016/0125823 A1 | 5/2016 | Huang et al. | |
| 2016/0125954 A1 | 5/2016 | Gu | |
| 2016/0253975 A1 | 9/2016 | Yang et al. | |
| 2016/0322115 A1 | 11/2016 | Xu et al. | |
| 2016/0335979 A1 | 11/2016 | Yamazaki et al. | |
| 2016/0351156 A1* | 12/2016 | Wu | G09G 3/3688 |
| 2016/0351159 A1 | 12/2016 | Yang et al. | |
| 2016/0358666 A1 | 12/2016 | Pang | |
| 2016/0365054 A1 | 12/2016 | Wu et al. | |
| 2016/0372063 A1 | 12/2016 | Li et al. | |
| 2017/0039969 A1 | 2/2017 | Wang | |
| 2017/0068385 A1 | 3/2017 | Lu et al. | |
| 2017/0069286 A1 | 3/2017 | Wu | |
| 2017/0076680 A1 | 3/2017 | Li et al. | |
| 2017/0125122 A1 | 5/2017 | Miyake | |
| 2017/0139292 A1 | 5/2017 | Yu et al. | |
| 2017/0160607 A1 | 6/2017 | Zhao et al. | |
| 2017/0178558 A1 | 6/2017 | Zhou et al. | |
| 2017/0186398 A1 | 6/2017 | Du | |
| 2017/0193937 A1 | 7/2017 | Du | |
| 2017/0200419 A1 | 7/2017 | Ma | |
| 2019/0386001 A1* | 12/2019 | Hong | H01L 27/0296 |

FOREIGN PATENT DOCUMENTS

| | | |
|---|---|---|
| CN | 103985363 | 8/2014 |
| CN | 104867439 | 8/2015 |
| CN | 104900206 | 9/2015 |
| CN | 105047127 | 11/2015 |
| CN | 105047172 | 11/2015 |
| CN | 105448224 | 3/2016 |
| CN | 105609138 | 5/2016 |
| CN | 106504719 | 3/2017 |
| CN | 106710541 | 5/2017 |
| CN | 106935220 | 7/2017 |
| CN | 108492761 | 9/2018 |
| JP | 2010073301 | 4/2010 |
| TW | 201314653 | 4/2013 |

OTHER PUBLICATIONS

"Office Action of China Counterpart Application", dated Jun. 2, 2021, pp. 1-8.

"Office Action of China Counterpart Application", dated Aug. 13, 2021, p. 1-p. 6.

* cited by examiner

SHIFT REGISTER AND GATE DRIVER CIRCUIT

CROSS-REFERENCE TO RELATED APPLICATION

This application claims the priority benefit of China application Ser. No. 201811424162.2, filed on Nov. 27, 2018. The entirety of the above-mentioned patent application is hereby incorporated by reference herein and made a part of this specification.

BACKGROUND OF THE INVENTION

1. Field of the Invention

The invention relates to a register design, and more particularly, relates to a shift register suitable for a gate driver on array (GOA) and a gate driver circuit thereof.

2. Description of Related Art

In general, in the field of driving technology for displays, a liquid-crystal display (LCD) and an electrophoretic display (EPD) usually utilize a driving signal and a scanning signal provided by a source driver circuit and a gate driver circuit to drive a display panel. Also, a gate driver on array (GOA) technology has been developed for reducing manufacturing costs of the displays. In other words, the gate driver circuit may be directly fabricated on a glass substrate instead of a driver chip fabricated from an external silicon chip. However, since the gate driver circuit is directly fabricated on the glass substrate, the gate driver circuit will occupy an area of the display panel and limit a display area of the display panel. Therefore, how to improve and increase the display area of the display panel with the gate driver circuit is one of the most important issues in the field. In view of this, several solutions will be proposed below.

SUMMARY OF THE INVENTION

The invention provides a shift register adapted for a gate driver on array (GOA) and a gate driver circuit thereof, which are capable of effectively increasing an area of the display area of the display panel.

A shift register of the invention includes an input unit, an output unit, an electrostatic discharge unit and a reset unit. The input unit provides an input signal. The output unit is coupled to the input unit and a gate output terminal. The output unit outputs an output signal through the gate output terminal according to the input signal. The electrostatic discharge unit is coupled to the output unit. After the gate output terminal outputs the output signal, the electrostatic discharge unit pulls down a voltage of the gate output terminal according to a low gate voltage. The reset unit is coupled to the input unit and the output unit. After the electrostatic discharge unit pulls down the voltage of the gate output terminal, the reset unit resets a voltage of a bootstrap node.

A gate driver circuit of the invention includes a plurality of shift registers as described above. In one driving cycle, each of the output units of the plurality of shift registers pulls up the voltage of the gate output terminal by a first clock signal according to the input signal such that the gate output terminal outputs the output signal, and then the electrostatic discharge unit pulls down the voltage of the gate output terminal. After the electrostatic discharge unit pulls down the voltage of the gate output terminal, each of the reset units of the plurality of shift registers resets the voltage of the bootstrap node by the low gate voltage according to a second clock signal. The first clock signal differs from the second clock signal by two gate line turn-on times in terms of a clock phase.

Based on the above, the shift register and the gate driver circuit of the invention can replace a pull-down transistor or reduce a layout area of the pull-down transistor on the display panel with use of the electrostatic discharge unit, so as to effectively increase the area of the display area of the display panel.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
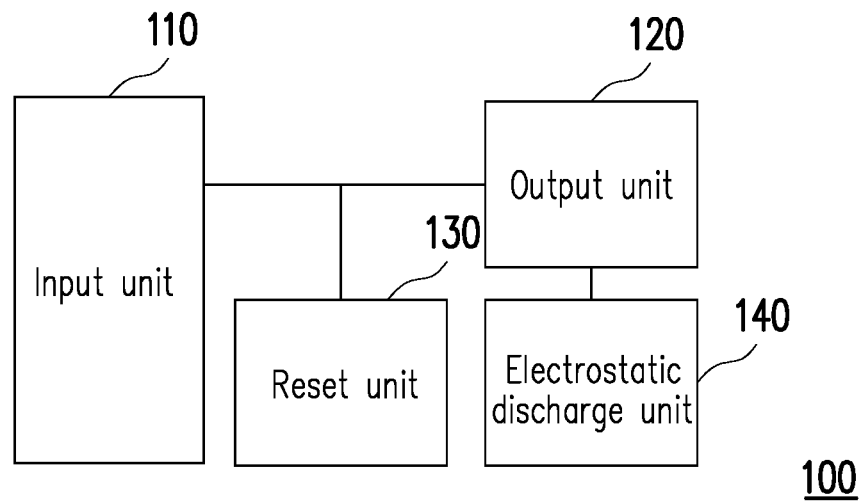
FIG. 1 is a schematic diagram of a shift register according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In order to make content of the invention more comprehensible, embodiments are described below as examples to prove that the invention can actually be realized. Moreover, elements/components/steps with same reference numerals represent same or similar parts in the drawings and embodiments.

FIG. 1 is a schematic diagram of a shift register according to an embodiment of the invention. With reference to FIG. 1, a shift register 100 of the invention includes an input unit 110, an output unit 120, a reset unit 130 and an electrostatic discharge unit 140. In this embodiment, the input unit 110 is coupled to the output unit 120 to provide an input signal to the output unit 120. The output unit 120 outputs an output signal through a gate output terminal according to the input signal. The reset unit 130 is coupled to the input unit 110 and the output unit 120. The electrostatic discharge unit 140 is coupled to the output unit 120. In this embodiment, after the input unit 120 outputs the output signal through the gate output terminal, the electrostatic discharge unit 140 pulls down a voltage of the gate output terminal according to a low gate voltage. Further, after the electrostatic discharge unit 140 pulls down the voltage of the gate output terminal, the reset unit 130 resets a voltage of a bootstrap node.

In this embodiment, the shift register 100 is adapted in a gate driver on array (GOA) of a display panel, and coupled to a gate line of the display panel through the gate output terminal. The shift register 100 provides the output signal to the gate line of the display panel by the output circuit 120 as a scanning signal. In this embodiment, the output circuit 120 provides a high voltage level signal to the gate output terminal, and the electrostatic discharge unit 140 discharges the voltage of the gate output terminal when the output circuit 120 stops providing the high voltage level signal to the gate output terminal. In other words, the electrostatic discharge unit 140 of this embodiment is configured to provide the function of pulling down the voltage. Next, after the electrostatic discharge unit 140 discharges the voltage of the gate output terminal, the reset unit 130 resets the voltage of the bootstrap node in the circuitry of the shift register 100, so as to complete an output task for one scanning signal. Further, other than being a pull-down circuit, the electrostatic discharge unit 140 of this embodiment can also provide an electrostatic protection function adapted between the shift register 100 and the display panel.

Moreover, in this embodiment, the display panel described above may refer to, for example, a display panel disposed in a liquid-crystal display (LCD), an organic light-emitting display (OLED) or an electrophoretic display (EPD), and the display panel may be, for example, a thin film transistor (TFT) panel made of glass or plastic.

Figure 2:
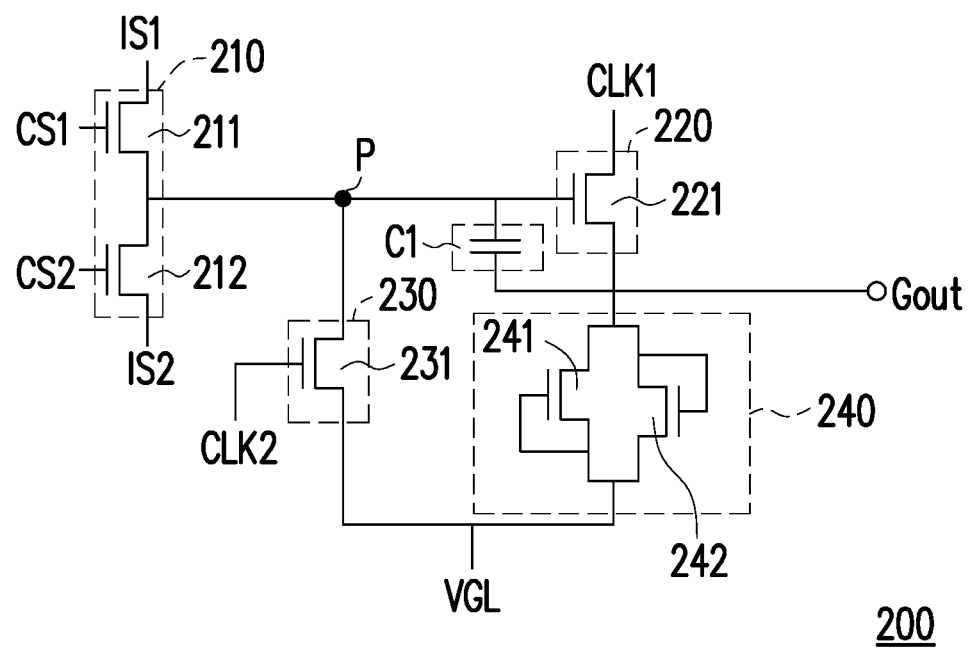
FIG. 2 is a circuit diagram of a shift register according to an embodiment of the invention.

FIG. 2 is a circuit diagram of a shift register according to an embodiment of the invention. With reference to FIG. 2, a shift register 200 includes an input unit 210, an output unit 220, a reset unit 230 and an electrostatic discharge unit 240. In this embodiment, the input unit 210 includes a first transistor 211 and a second transistor 212. A control terminal of the first transistor 211 receives a first control signal CS1, and a first terminal of the first transistor 211 receives a first input signal IS1. A control terminal of the second transistor 212 receives a second control signal CS2. A first terminal of the second transistor 212 is coupled to a second terminal of the first transistor 211, and a second terminal of the second transistor 212 receives a second input signal IS2. The second terminal of the first transistor 211 and the first terminal of the second transistor 212 are coupled to the output unit 220. Each of the first transistor 211 and the second transistor 212 is configured to periodically (or selectively) provide the input signal to the output unit 120. In this embodiment, the first input signal IS1 may be one of a forward input signal and a backward input signal, and the second input signal IS2 may be another one of the forward input signal and the backward input signal. Signal types of the first input signal IS1 and the second input signal IS2 may be determined according to different driving states, which are not particularly limited by the invention.

In this embodiment, the output unit 220 includes a third transistor 221. A control terminal of the third transistor 221 is coupled to the second terminal of the first transistor 211 and the first terminal of the second transistor 212. Here, a first terminal of the third transistor 221 receives a first clock signal CLK1, and a second terminal of the third transistor 221 is coupled to a gate output terminal Gout. In this embodiment, the third transistor 221 is configured to determine whether to output the first clock signal CLK1 as an output signal to the gate output terminal Gout according to the input signal provided by the input unit 210. In other words, the output unit 220 may be regarded as a pull-up circuit, and used to pull up a voltage of the gate output terminal Gout. In this embodiment, a capacitor C1 is included between the control terminal of the third transistor 221 and both of the gate output terminal Gout and the second terminal of the third transistor 221. The capacitor C1 is configured for the purpose of bootstrap, and is configured to stabilize the characteristic of cut off voltage level of an output signal of the gate output terminal Gout to protect the display panel.

In this embodiment, the reset unit 230 includes a fourth transistor 231. A control terminal of the fourth transistor 231 receives a second clock signal CLK2. A first terminal of the fourth transistor 231 is coupled to a bootstrap node P on a signal line between the input unit 210 and the output unit 220. A second terminal of the fourth transistor 231 receives a low gate voltage VGL. In this embodiment, the fourth transistor 231 is configured to periodically reset a voltage of the bootstrap node P to the low gate voltage VGL according to the second clock signal CLK2 to stabilize the shift register 200.

In this embodiment, the electrostatic discharge unit 240 includes a fifth transistor 241 and a sixth transistor 242. A first terminal of the fifth transistor 241 is coupled to the gate output terminal Gout. A control terminal of the fifth transistor 241 is coupled to a second terminal of the fifth transistor 241, and the second terminal of the fifth transistor receives the low gate voltage VGL. A first terminal of the sixth transistor 242 receives the low gate voltage VGL. A control terminal of the sixth transistor 242 is coupled to a second terminal of the sixth transistor 242, and the second terminal of the sixth transistor 242 is coupled to the gate output terminal Gout. The first terminal of the fifth transistor 241 is coupled to the second terminal of the sixth transistor 242, and the second terminal of the fifth transistor 241 is coupled to the first terminal of the sixth transistor 242. In this embodiment, when there is a voltage difference between the voltage of the gate output terminal Gout and the low gate voltage VGL, the fifth transistor 241 and the sixth transistor 242 are used to discharge the voltage of the gate output terminal Gout. In other words, the electrostatic discharge unit 240 may be regarded as a pull-down circuit, and used to pull down the voltage of the gate output terminal Gout.

However, in an embodiment, the shift register 200 may also additionally include a pull-down transistor. A first terminal of the pull-down transistor is coupled to the gate output terminal Gout, and a second terminal of the pull-down transistor receives the low gate voltage VGL. The pull-down transistor may correspond to the third transistor 221 to pull down the voltage of the gate output terminal Gout. In other words, in an embodiment, the electrostatic discharge unit 240 can be combined with the pull-down transistor to simultaneously pull down the voltage of the gate output terminal Gout. Therefore, since the electrostatic discharge unit 240 and the pull-down transistor can simultaneously pull down the voltage of the gate output terminal Gout, an area of the pull-down transistor may be effectively reduced.

In this embodiment, the shift register 200 is configured for conducting a bidirectional driving, and the first control signal CS1 and the second control signal CS2 received by the control terminals of the first transistor 211 and the second transistor 212 of the input unit 210 are used to receive an output signal of the shift register at a previous stage or a next stage, so as to periodically (or selectively) provide the forward input signal with a high gate voltage or the backward input signal with the low gate voltage to the output unit 220. In this embodiment, after the output unit 220 receives an input voltage provided by the input unit 210, the output unit 220 outputs the output signal to the gate output terminal Gout. Also, when the output unit 220 stops receiving the input voltage provided by the input unit 210, the electrostatic discharge unit 240 discharges the voltage of the gate output terminal Gout. In other words, the output unit 220 pulls up the voltage of the gate output terminal Gout, and the electrostatic discharge unit 240 pulls down the voltage of the gate output terminal Gout. The output unit 220 and the electrostatic discharge circuit 240 can make the output signal output to the gate line of the display panel by the gate output terminal Gout become a periodically changing scanning signal. Lastly, after the electrostatic discharge circuit 240 completes pulling down the voltage of the gate output terminal Gout, the reset unit 230 then resets the voltage of the bootstrap node P. In this way, a circuit structure of the shift register 200 of this embodiment does not require a large-area pull-down circuit design. The shift register 200 of this embodiment can effectively discharge the voltage of the gate output terminal Gout through the electrostatic discharge circuit 240 between the shift register 200 and the display panel.

In addition, in this embodiment, each of the transistors described above may be, for example, a thin film transistor (TFT), a metal oxide thin film transistor (MOTFT), a metal oxide semiconductor field effect transistor (MOSFET) or a junction field effect transistor (JFET).

Figure 3:
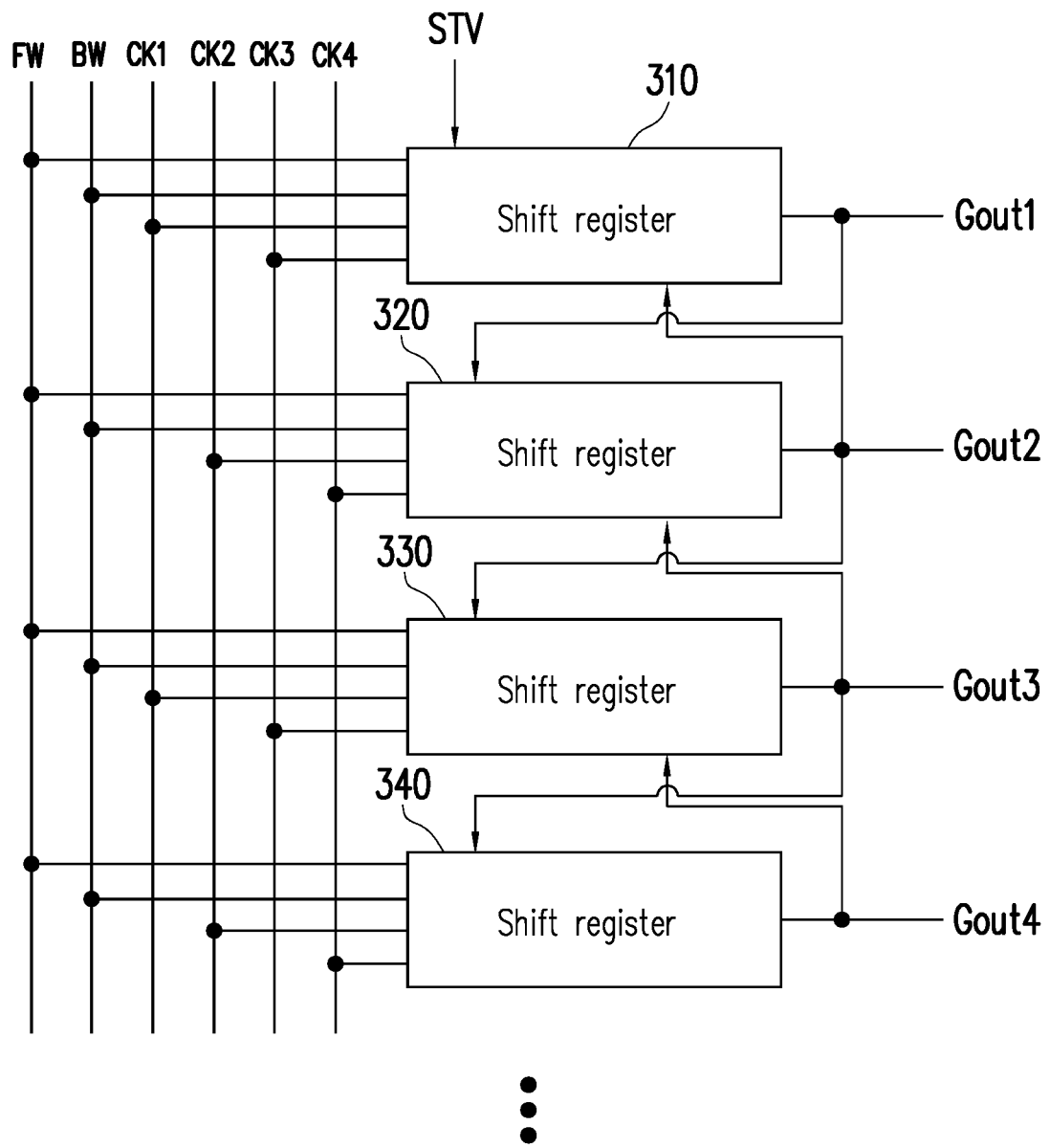
FIG. 3 is a schematic diagram of a gate driver circuit according to an embodiment of the invention.
Figure 4:
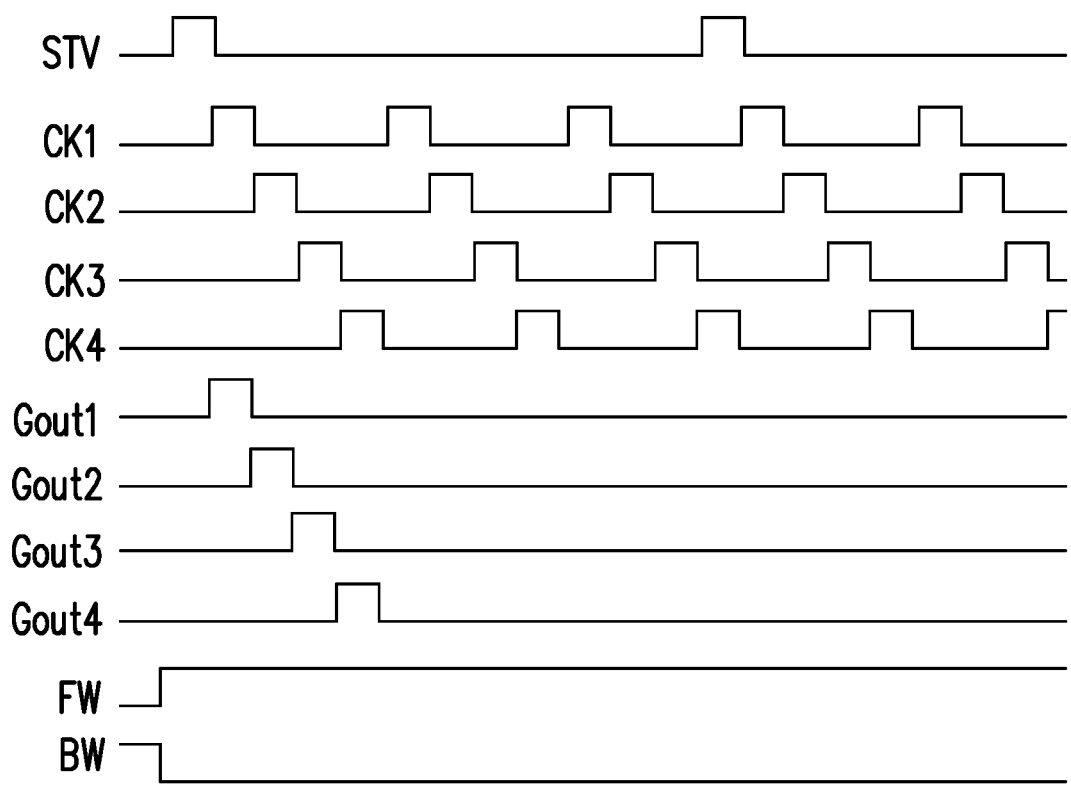
FIG. 4 is a timing diagram for driving the gate driver circuit according to the embodiment of FIG. 3.

FIG. 3 is a schematic diagram of a gate driver circuit according to an embodiment of the invention. FIG. 4 is a timing diagram for driving the gate driver circuit according to the embodiment of FIG. 3. With reference to FIG. 3 and FIG. 4, a gate driver circuit 300 is a gate driver on array. In this embodiment, the gate driver circuit 300 includes a plurality of shift registers 310 to 340. Here, the number of the shift registers is not limited to that shown by FIG. 3, and the shift registers 310 to 340 may be, for example, the shift registers described in the foregoing embodiments of FIG. 1 and FIG. 2. Accordingly, sufficient teachings, suggestions, and implementation descriptions regarding related circuit features and implementation details of the shift registers 310 to 340 of this embodiment may be obtained from the foregoing embodiments of FIG. 1 and FIG. 2, which are not repeated hereinafter.

In this embodiment, the gate driver circuit 300 can increase a discharge time of the electrostatic discharge circuit of each of the shift registers 310 to 340 by a timing control scheme, so as to effectively reduce a layout area of the electrostatic discharge circuit of each of the shift registers 310 to 340 on the display panel. In detail, the gate driver circuit 300 can drive the shift registers 310 to 340 by four reference clock signals CK1 to CK4, and clock phases of the four reference clock signals CK1 to CK4 sequentially differ by one gate line turn-on time (as shown by FIG. 4). In this embodiment, a first clock signal of each of the shift registers 310 to 340 is the first or second one of the four reference clock signals CK1 to CK4, and the second clock signal of each of the shift registers 310 to 340 is the third or fourth one of the four reference clock signals CK1 to CK4. Also, the first control signal received by each of the shift registers 310 to 340 is an output signal of the shift register at a previous stage, and the second control signal of each of the shift registers 310 to 340 is an output signal of the shift register at a next stage.

In detail, as shown by FIG. 3, the shift register 310/330 receives the reference clock signal CK1 as the first clock signal received by the output unit, and the shift register 310/330 receives the reference clock signal CK3 as the second clock signal received by the reset unit. The shift register 320/340 receives the reference clock signal CK2 as the first clock signal received by the output unit, and the shift register 320/340 receives the reference clock signal CK4 as the second clock signal received by the reset unit. After the shift register 310 receives a start signal STV, the shift register 310 outputs an output signal Gout1 according to a forward input signal FW and a backward input signal BW. As shown by FIG. 3, the first control signals received by the shift registers 320 to 340 are output signals Gout1 to Gout3 of the shift registers 310 to 330 respectively at the previous stage, and the second control signals of the shift registers 310 to 330 are output signal Gout2 to Gout4 of the shift registers 320 to 340 respectively at the next stage. By analogy, the shift registers 310 to 340 can sequentially output the output signals Gout1 to Gout4 according to the forward input signal FW and the backward input signal BW.

In other words, because the first clock signal received by the output unit of each of the shift registers 310 to 340 in FIG. 3 differs from the second clock signal received by the reset unit by two gate line turn-on times in terms of a clock phase, the electrostatic discharge unit of each of the shift registers 310 to 340 will have enough discharge time before the reset unit resets the voltage of the bootstrap node. In other words, because the electrostatic discharge units of the shift registers 310 to 340 of this embodiment do not require a large-area transistor design, the layout area occupied by the shift registers 310 to 340 on the display panel may be effectively reduced.

Figure 5:
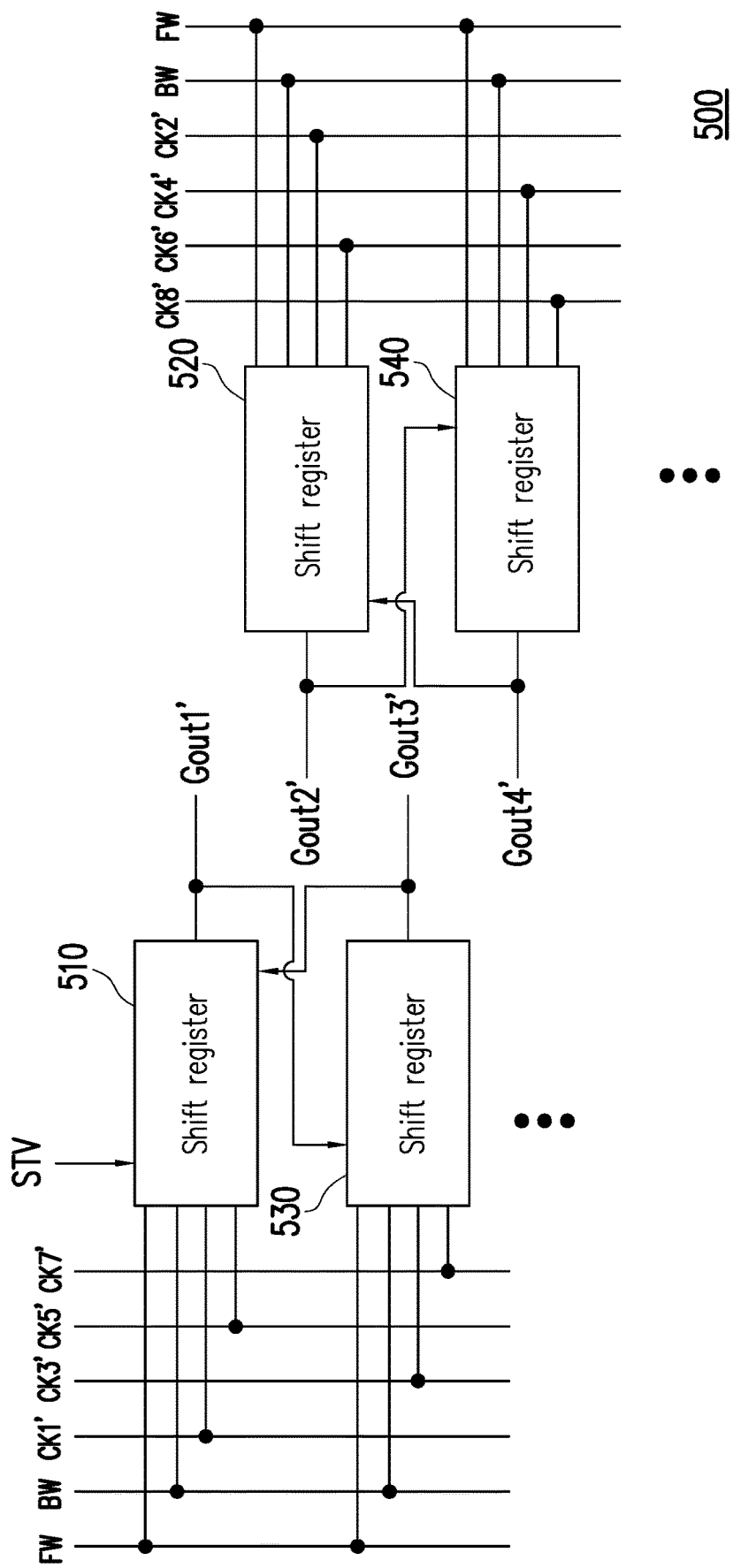
FIG. 5 is a schematic diagram of a gate driver circuit according to another embodiment of the invention.
Figure 6:
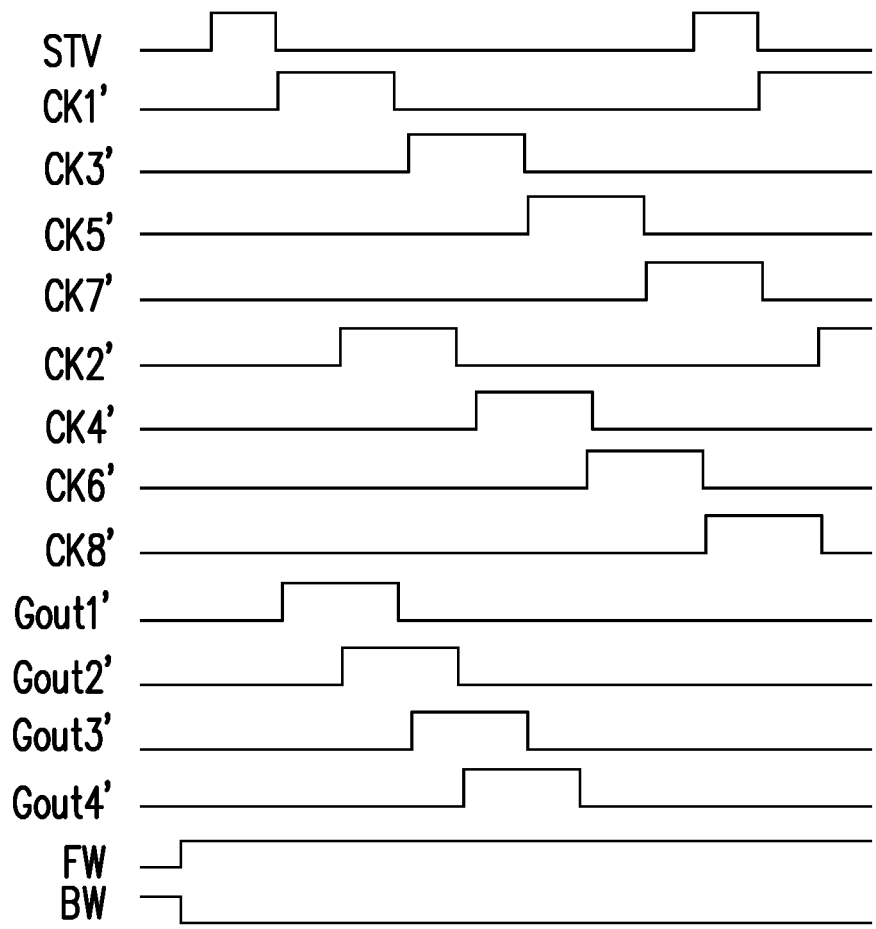
FIG. 6 is a timing diagram for driving the gate driver circuit according to the embodiment of FIG. 5.

FIG. 5 is a schematic diagram of a gate driver circuit according to another embodiment of the invention. FIG. 6 is a timing diagram for driving the gate driver circuit according to the embodiment of FIG. 5. With reference to FIG. 5 and FIG. 6, a gate driver circuit 500 is a gate driver on array. In this embodiment, the gate driver circuit 500 includes a plurality of shift registers 510 to 540. Here, the number of the shift registers is not limited to that shown by FIG. 5, and the shift registers 510 to 540 may be, for example, the shift registers described in the foregoing embodiments of FIG. 1 and FIG. 2. Accordingly, sufficient teachings, suggestions, and implementation descriptions regarding related circuit features and implementation details of the shift registers 510 to 540 of this embodiment may be obtained from the foregoing embodiments of FIG. 1 and FIG. 2, which are not repeated hereinafter.

In this embodiment, the gate driver circuit 500 can increase a discharge time of the electrostatic discharge circuit of each of the shift registers 510 to 540 by a timing control scheme, so as to effectively reduce a layout area of the electrostatic discharge circuit of each of the shift registers 510 to 540 on the display panel. In detail, the gate driver circuit 500 can drive the shift registers 510 to 540 by eight reference clock signals CK1' to CK8', and clock phases of the eight reference clock signals CK1' to CK8' sequentially differ by one-half gate line turn-on time (as shown by FIG. 6). In this embodiment, the shift registers 510 to 540 are divided into an odd group and an even group. Here, the shift registers 510 and 530 in the odd group and the shift registers 520 and 540 in the even group are separately disposed on two sides of the display panel so the display panel of this embodiment can have the characteristics of a narrow border.

In this embodiment, the first clock signal of each of the shift registers 510 and 530 in the odd group is the first or third one of the eight reference clock signals CK1' to CK8'. The first clock signal of each of the shift registers 520 and 540 in the even group is the second or fourth one of the eight reference clock signals CK1' to CK8'. The second clock signal of each of the shift registers 510 and 530 in the odd group is the fifth or seventh one of the eight reference clock signals CK1' to CK8'. The second clock signal of each of the shift registers 520 and 540 in the even group is the sixth or eighth one of the eight reference clock signals CK1' to CK8'. In this embodiment, the first control signal received by each of the shift registers 510 to 540 is an output signal of the shift register at a stage before a previous stage, and the second control signal of each of the shift registers 510 to 540 is an output signal of the shift register at a stage after a next stage.

In detail, as shown by FIG. 5, the shift register 510/530 receives the reference clock signal CK1'/CK3' as the first clock signal received by the output unit, and the shift register 510/530 receives the reference clock signal CK5'/CK7' as the second clock signal received by the reset unit. The shift register 520/540 receives the reference clock signal CK2'/CK4' as the first clock signal received by the output unit, and the shift register 520/540 receives the reference clock signal CK6'/CK8' as the second clock signal received by the reset unit. After the shift register 510 receives a start signal STV, the shift register 510 outputs an output signal Gout1 according to a forward input signal FW and a backward input signal BW. As shown by FIG. 5, the first control signals received by the shift registers 530 and 540 are output signals Gout1' and Gout2' of the shift registers 510 and 520 respectively at the stage before the previous stage, and the second control signals of the shift registers 510 and 520 are output signal Gout3' and Gout4' of the shift registers 530 and 540 respectively at the stage after the next stage. By analogy, the shift registers 510 to 540 can sequentially output the output signals Gout1' to Gout4' according to the forward input signal FW and the backward input signal BW.

In other words, because the first clock signal received by the output unit of each of the shift registers 510 to 540 in FIG. 5 differs from the second clock signal received by the reset unit by two gate line turn-on times in terms of a clock phase, the electrostatic discharge unit of each of the shift registers 510 to 540 will have enough discharge time before the reset unit resets the voltage of the bootstrap node. In other words, because the electrostatic discharge units of the shift registers 510 to 540 of this embodiment do not require a large-area transistor design, the layout area occupied by the shift registers 510 to 540 on the display panel may be effectively reduced. Further, because the shift registers 510 to 540 are separately disposed on two sides of the display panel, the display panel of this embodiment can have the characteristics of a narrow border.

Figure 7:
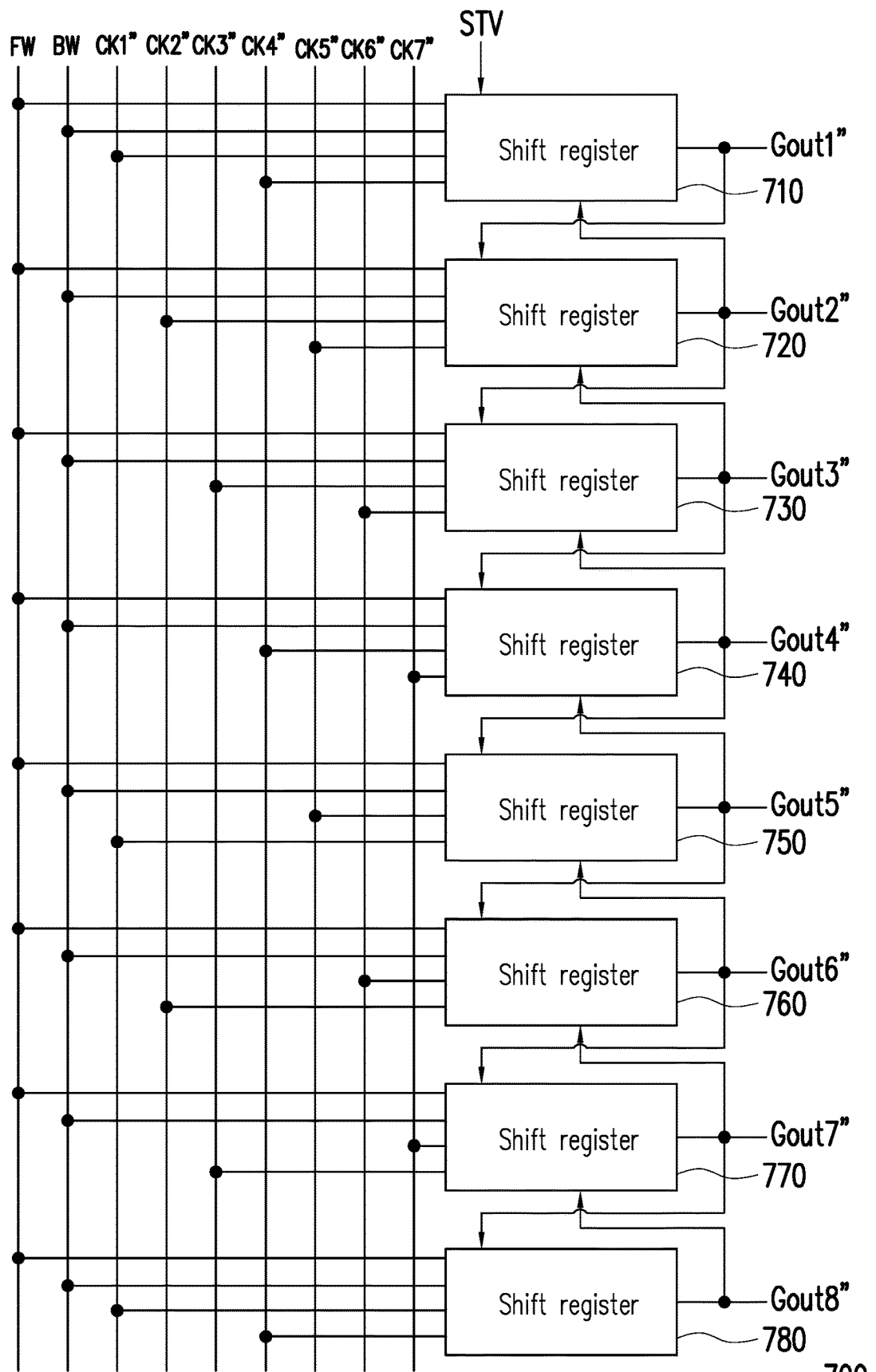
FIG. 7 is a schematic diagram of a gate driver circuit according to yet another embodiment of the invention.
Figure 8:
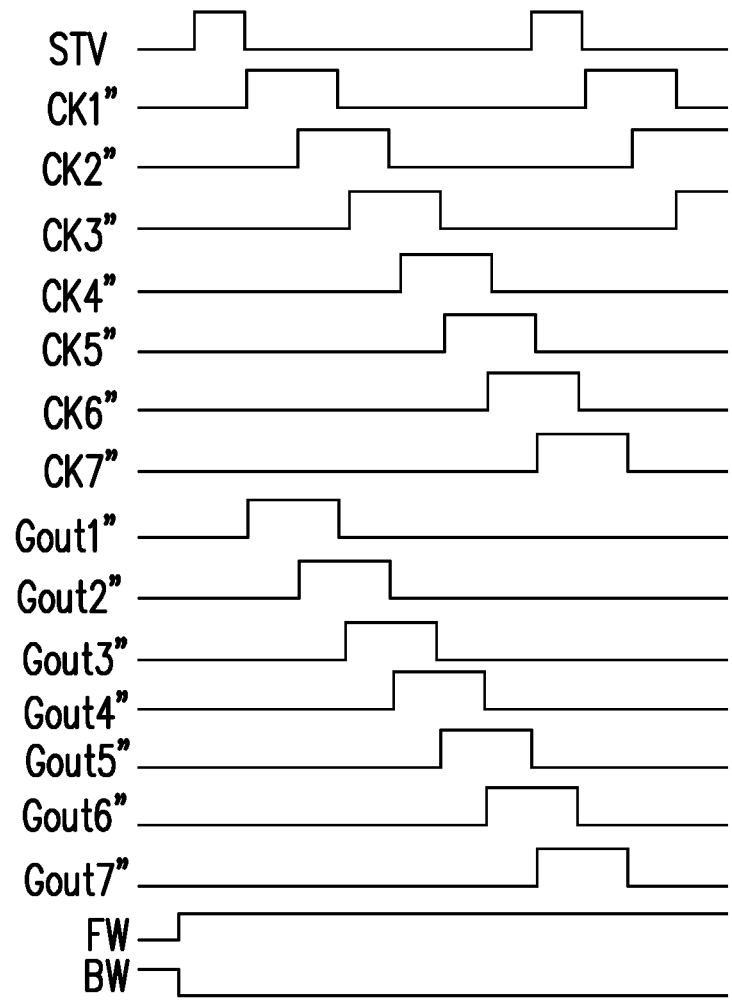
FIG. 8 is a timing diagram for driving the gate driver circuit according to the embodiment of FIG. 7.

FIG. 7 is a schematic diagram of a gate driver circuit according to yet another embodiment of the invention. FIG. 8 is a timing diagram for driving the gate driver circuit according to the embodiment of FIG. 7. With reference to FIG. 7 and FIG. 8, a gate driver circuit 700 is a gate driver on array. In this embodiment, the gate driver circuit 700 includes a plurality of shift registers 710 to 780. Here, the number of the shift registers is not limited to that shown by FIG. 7, and the shift registers 710 to 780 may be, for example, the shift registers 100 and 200 described in the foregoing embodiments of FIG. 1 and FIG. 2. Accordingly, sufficient teachings, suggestions, and implementation descriptions regarding related circuit features and implementation details of the shift registers 710 to 780 of this embodiment may be obtained from the foregoing embodiments of FIG. 1 and FIG. 2, which are not repeated hereinafter.

In this embodiment, the gate driver circuit 700 can increase a discharge time of the electrostatic discharge circuit of each of the shift registers 710 to 780 by a timing control scheme, so as to effectively reduce a layout area of the electrostatic discharge circuit of each of the shift registers 710 to 780 on the display panel. For instance, the gate driver circuit 700 can drive the shift registers 710 to 780 by seven reference clock signals CK1" to CK7", and clock phases of the eight reference clock signals CK1" to CK7" sequentially differ by one-half gate line turn-on time (as shown by FIG. 8). In this embodiment, the first clock signals of the shift registers 710 to 780 are sequentially selected from one of the seven reference clock signals CK1" to CK7", and the second clock signals of the shift registers 710 to 780 are sequentially selected from another one of the seven reference clock signals CK1" to CK7'. It should be noted that, the first clock signal of each of the shift registers 710 to 780 differs from the second clock signal by two gate line turn-on times. Also, the first control signal received by each of the shift registers 710 to 780 is an output signal of the shift register (710 to 780) at a previous stage, and the second control signal of each of the shift registers 710 to 780 is an output signal of the shift register at a next stage.

In detail, as shown by FIG. 7, the shift register 710 receives the reference clock signal CK1" as the first clock signal received by the output unit, and the shift register 710 receives the reference clock signal CK4" as the second clock signal received by the reset unit. Therefore, the first clock signal received by the shift register 710 differs from the second clock signal by two gate line turn-on times. The shift register 720 receives the reference clock signal CK2" as the first clock signal received by the output unit, and the shift register 720 receives the reference clock signal CK5" as the second clock signal received by the reset unit. Therefore, the first clock signal received by the shift register 720 differs from the second clock signal by two gate line turn-on times. By analogy, the shift registers 730 to 780 sequentially select two reference clock signals that differ by two gate line turn-on times as the first clock signal and the second clock signal, respectively.

More specifically, after the shift register 710 receives a start signal STV, the shift register 710 outputs an output signal Gout1" according to a forward input signal FW and a backward input signal BW. As shown by FIG. 7, the first control signals received by the shift registers 720 to 780 are output signals Gout1" to Gout7" of the shift registers 710 to 770 respectively at the previous stage, and the second control signals of the shift registers 710 to 770 are output signal Gout2" to Gout8" of the shift registers 720 to 780 respectively at the next stage. By analogy, the shift registers 710 to 780 can sequentially output the output signals Gout1" to Gout8" according to the forward input signal FW and the backward input signal BW.

In other words, because the first clock signal received by the output unit of each of the shift registers 710 to 780 in FIG. 7 differs from the second clock signal received by the reset unit by two gate line turn-on times in term of a clock phase, the electrostatic discharge unit of each of the shift registers 710 to 780 will have enough discharge time before the reset unit reset the voltage of the bootstrap node. In other words, because the electrostatic discharge units of the shift registers 710 to 740 of this embodiment do not require a large-area transistor design, the layout area occupied by the shift registers 710 to 740 on the display panel may be effectively reduced.

Nonetheless, in an embodiment, the number of the reference clock signals of the gate driver circuit 700 is not limited to that shown by FIG. 7, and a method for selecting the first clock signal and the second clock signal is not limited to that shown by FIG. 7 either. For instance, if the first clock signal and the second clock signal of each of the shift registers 710 to 780 of the gate driver circuit 700 were to differ by M gate line turn-on times, the number N of the reference clock signals may at least be designed as 3M+1 (N=3M+1), wherein N and M are positive integers greater than zero. Also, the first control signals received by the shift registers 720 to 780 are the output signals respectively from the previous stage, and the second control signal of the shift registers 710 to 770 are the output signals respectively from the next stage.

In summary, according to the shift register and the gate driver circuit of the invention, the electrostatic discharge unit is configured as the pull-down circuit so the voltage of the gate output terminal can be effectively pulled down. Therefore, the shift register and the gate driver circuit of the invention can effectively reduce the area occupied by the pull-down transistor on the display panel, or the pull-down transistor may be directly replaced by the electrostatic discharge unit. Moreover, the shift register and the gate driver circuit of the invention can also increase the discharge time of the electrostatic discharge unit by designing the clock signals to effectively reduce the transistor area of the electrostatic discharge unit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A gate driver circuit, comprising:
a plurality of shift registers, wherein each of the plurality of shift registers comprises:
an input unit, providing an input signal;
an output unit, coupled to the input unit and a gate output terminal, the output unit is based on a first clock signal and outputting an output signal through the gate output terminal according to the input signal;
an electrostatic discharge unit, coupled to the output unit, the electrostatic discharge unit pulling down a voltage of the gate output terminal according to a low gate voltage after the gate output terminal outputs the output signal; and
a reset unit, coupled to the input unit and the electrostatic discharge unit, the reset unit resets a voltage of a bootstrap node on a signal line between the input unit, the reset unit and the output unit to the low gate voltage according to a second clock signal after the electrostatic discharge unit pulls down the voltage of the gate output terminal, wherein the first clock signal differs from the second clock signal by two gate line turn-on times in terms of a clock phase,
wherein the electrostatic discharge unit comprises:
a fifth transistor, wherein a first terminal of the fifth transistor is coupled to the gate output terminal, wherein a control terminal of the fifth transistor is coupled to a second terminal of the fifth transistor, and the second terminal of the fifth transistor receives the low gate voltage; and
a sixth transistor, wherein a first terminal of the sixth transistor receives the low gate voltage, wherein a control terminal of the sixth transistor is coupled to a second terminal of the sixth transistor, and the second terminal of the sixth transistor is coupled to the gate output terminal,
wherein the first terminal of the fifth transistor is coupled to the second terminal of the sixth transistor, and the second terminal of the fifth transistor is coupled to the first terminal of the sixth transistor,
wherein in one driving cycle, each of the output units of the plurality of shift registers pulls up the voltage of the gate output terminal by the first clock signal according to the input signal such that the gate output terminal outputs the output signal, and then the electrostatic discharge unit pulls down the voltage of the gate output terminal, wherein after the electrostatic discharge unit pulls down the voltage of the gate output terminal, each of the reset units of the plurality of shift registers resets the voltage of the bootstrap node by the low gate voltage according to the second clock signal,
wherein the gate driver circuit drives the plurality of shift registers by a plurality of reference clock signals, and clock phases of the plurality of reference clock signals sequentially differ by one-half gate line turn-on time.

2. The gate driver circuit according to claim 1, wherein the gate driver circuit drives the plurality of shift registers by eight reference clock signals, and clock phases of the eight reference clock signals sequentially differ by one-half gate line turn-on time, wherein the plurality of shift registers are divided into an odd group and an even group,
wherein the first clock signal of the plurality of shift registers in the odd group is the first or the third one of the eight reference clock signals, and the first clock signal of the plurality of shift registers in the even group is the second or the fourth one of the eight reference clock signals,
wherein the second clock signal of the plurality of shift registers in the odd group is the fifth or the seventh one of the eight reference clock signals, and the second clock signal of the plurality of shift registers in the even group is the sixth or the eighth one of the eight reference clock signals,
wherein the first control signal of the plurality of shift registers is an output signal of the shift register at a stage before a previous stage, and the second control signal of the plurality of shift registers is an output signal of the shift register at a stage after a next stage.

3. The gate driver circuit according to claim 1,
wherein the first clock signals the plurality of shift registers are sequentially selected from one of the plurality of reference clock signals, and wherein the second clock signals of the plurality of shift registers are sequentially selected from another one of the plurality of reference clock signals, wherein the one of the plurality of reference clock signals differs from the other one of the plurality of reference clock signals by two gate line turn-on times,
wherein the first control signal of the plurality of shift registers is an output signal of the shift register at a previous stage, and the second control signal of the plurality of shift registers is an output signal of the shift register at a next stage.

* * * * *